US009232652B2

(12) United States Patent
Fushie et al.

(10) Patent No.: US 9,232,652 B2
(45) Date of Patent: Jan. 5, 2016

(54) MANUFACTURING METHOD OF SUBSTRATE, MANUFACTURING METHOD OF WIRING SUBSTRATE, GLASS SUBSTRATE AND WIRING SUBSTRATE

(71) Applicant: HOYA CORPORATION, Shinjuku-ku, Tokyo (JP)

(72) Inventors: Takashi Fushie, Shinjuku-ku (JP); Hajime Kikuchi, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 130 days.

(21) Appl. No.: 13/624,448

(22) Filed: Sep. 21, 2012

(65) Prior Publication Data
US 2013/0075146 A1   Mar. 28, 2013

(30) Foreign Application Priority Data

Sep. 22, 2011   (JP) .................................. 2011-208143
Aug. 15, 2012   (JP) .................................. 2012-180212

(51) Int. Cl.
| H05K 1/11 | (2006.01) |
| H05K 3/00 | (2006.01) |
| H05K 3/42 | (2006.01) |
| H05K 1/03 | (2006.01) |
| H05K 3/38 | (2006.01) |

(52) U.S. Cl.
CPC .............. *H05K 1/115* (2013.01); *H05K 3/0017* (2013.01); *H05K 3/423* (2013.01); *H05K 1/0306* (2013.01); *H05K 3/002* (2013.01); *H05K 3/0023* (2013.01); *H05K 3/0029* (2013.01); *H05K 3/381* (2013.01); *H05K 2201/09827* (2013.01); *H05K 2201/09854* (2013.01); *H05K 2201/2072* (2013.01); *H05K 2203/1476* (2013.01); *H05K 2203/1572* (2013.01); *Y10T 428/24273* (2015.01)

(58) Field of Classification Search
CPC ... H05K 3/002; H05K 3/0023; H05K 3/0026; H05K 3/0029; H05K 3/0032; H05K 3/0035; H05K 3/0038; H05K 3/0041; H05K 1/115; H05K 1/116
USPC .................................................. 174/262–266
See application file for complete search history.

(56) References Cited

U.S. PATENT DOCUMENTS

| 7,910,837 B2 * | 3/2011 | Sekine et al. ................. 174/262 |
| 2005/0116640 A1 * | 6/2005 | Yoo .............................. 313/582 |
| 2006/0170110 A1 * | 8/2006 | Akram et al. ................. 257/774 |
| 2007/0166849 A1 * | 7/2007 | Shimizu et al. ................ 438/20 |
| 2010/0018553 A1 * | 1/2010 | Mikhaylichenko et al. .... 134/18 |

FOREIGN PATENT DOCUMENTS

WO      2005/027605 A1      3/2005

* cited by examiner

*Primary Examiner* — Jeremy C Norris
(74) *Attorney, Agent, or Firm* — Sughrue Mion, PLLC

(57) ABSTRACT

There is provided that a substrate comprising a glass substrate 2 constituted by a glass including a silicon oxide. The glass substrate has a through-hole 3 communicating with a front surface and a rear surface of the glass substrate, and filled with a metal material. The substrate is realized by forming an anchor part by selectively etching a silicon oxide on a sidewall surrounding an inside of said through-hole 3 before filling the metal material and by filling the inside of said through-hole 3 with the metal material after forming the anchor part.

16 Claims, 7 Drawing Sheets

MANUFACTURING METHOD OF SUBSTRATE, MANUFACTURING METHOD OF WIRING SUBSTRATE, GLASS SUBSTRATE AND WIRING SUBSTRATE

BACKGROUND OF THE INVENTION

1. Field of the Invention

The present invention relates to a manufacturing method of a substrate, a manufacturing method of a wiring substrate, a glass substrate and a wiring substrate.

2. Description of the Related Art

In recent years, with respect to a wiring substrate mounted with electronic components such as MEMS (Micro Electro Mechanical System), there is a demand for enabling high-density mounting of electronic components and so on with ensuring connection reliability. In response to this demand, the present inventors have proposed that by using, not a resin substrate, a glass substrate which has good properties such as smoothness, hardness, insulation and heat resistance as a core substrate and by filling with metal a through-hole communicating with a front surface and a rear surface of the glass substrate, conduction of each electrical wiring formed on the front and rear surfaces of the substrate can be surely ensured; thereby making it possible to respond to finer wiring, higher density and so on (for example, referring to patent document 1).

The wiring substrate composed of such glass substrate is manufactured by the following procedure. Specifically, as described in, for example, the patent document 1, a step of filling the through-hole with metal by plating method is performed after performing a step of forming the through-hole on the glass substrate. Then, in the earlier stage of the step of filling the through-hole with metal, either one of the two opening parts of the through-hole formed on the front and rear surfaces of the glass substrate is sealed with metal, after that, by depositing metal on the bottom of the sealed hole from the opening part side and by growing metal toward the opening part; the through-hole is filled with metal.

Patent document 1: WO2005/027605

BRIEF SUMMARY OF THE INVENTION

When filling the through-hole with metal in this way, airtightness between sidewalls surrounding an inside of the through-hole and filled metal (such as gas barrier property) is low. If the airtightness is low, a leak occurs, which is a flow of gas from the place where the airtightness is low. Metal layers are stacked on the front and rear surfaces of the glass substrate in a predetermined gas atmosphere, for example, such as the case of forming a wiring pattern and the like on the glass substrate with the through-hole filled with metal. However, the above low airtightness leads to a problem that the stacking control of the metal layers is impeded due to the influence of the gas leak.

The present invention is proposed to solve the above problem and is to provide a manufacturing method of a substrate and a manufacturing method of a wiring substrate, a glass substrate and a wiring substrate which are capable of making the airtightness between sidewalls surrounding the inside of the through-hole and metal material filled in the hole higher, and preventing the gas leak.

One invention disclosed in the specification is a manufacturing method of a substrate. In the manufacturing method of the substrate, a substrate having a glass substrate composed of a glass including a silicon oxide is manufactured and a through-hole communicating with a front surface and a rear surface of the glass substrate is filled with metal material.

It is characteristic that the manufacturing method of the substrate includes an etching step of forming an anchor part by selectively etching a silicon oxide located on near a sidewall surrounding an inside of the through-hole before filling with a metal material; and a filling step of filling the inside of the through-hole with the metal material after the etching step.

The term "silicon oxide" here shows a substance shown by a compositional formula of "$Si_xO_y$," and, for example, silicon dioxide ($SiO_2$) is exemplified. "$Si_xO_y$," includes not only a crystalline substance of silicon dioxide but also a quartz glass which has an amorphous structure of silicon dioxide. The term "silicon oxide" here also includes a substance in which a part of Si site in the structure whose main component is silicon oxide is substituted by Al or other elements.

In the manufacturing method of the substrate, the glass is preferably a crystallized glass. In the crystallized glass, molecular structure of a crystalline part differs from that of an amorphous part. Also, with respect to components of the crystalline part, a single crystalline body may be diffused or more than one kind of crystalline body may be diffused. That is, it is thought that in the crystallized glass, a plurality of clusters having different structures (the crystalline structure or the amorphous structure) is diffused at random.

According to the present invention, silicon oxide part exposed on the sidewall of the through-hole is selectively etched and then the complicated anchor part can be formed. The filled metal in the through-hole penetrates into the complicated anchor part and is engaged with the complicated anchor part; thereby improving gas barrier property between the glass substrate and the filled metal.

In the manufacturing method of the substrate, in the etching step, a mixture solution of acid ammonium fluoride and strong acid ammonium salt is preferably used as the etching solution.

By using the etching solution which includes not only the acid ammonium fluoride but also the strong acid ammonium salt, etching selectivity to the silicon oxide improves, which is preferable.

As for the strong acid ammonium salt, for example, ammonium sulfate, ammonium nitrate, ammonium perchlorate and ammonium halide are exemplified. Among these, the ammonium sulfate is more preferable.

Another aspect of the invention described here is a manufacturing method of a wiring substrate. Specifically, the wiring is formed on at least one surface of the glass substrate of the above configuration.

Another aspect of the invention described here is a glass substrate. The glass substrate is the glass substrate where metal is filled inside the through-hole communicating with a front surface and a rear surface of the substrate. It is characteristic that an anchor part is formed on the sidewall surrounding the inside of the through-hole and metal penetrates into the anchor part.

Another aspect of the invention described here is a wiring substrate. With respect to the wiring substrate, it is characteristic that a wiring pattern is formed on at least one of one surface and the other surface of the glass substrate of the above configuration.

According to the present invention, it is possible to make the airtightness higher between sidewalls surrounding the inside of the through-hole and metal material filled in the hole, and to prevent the gas leak.

DETAILED DESCRIPTION OF THE INVENTION

Figure 1:
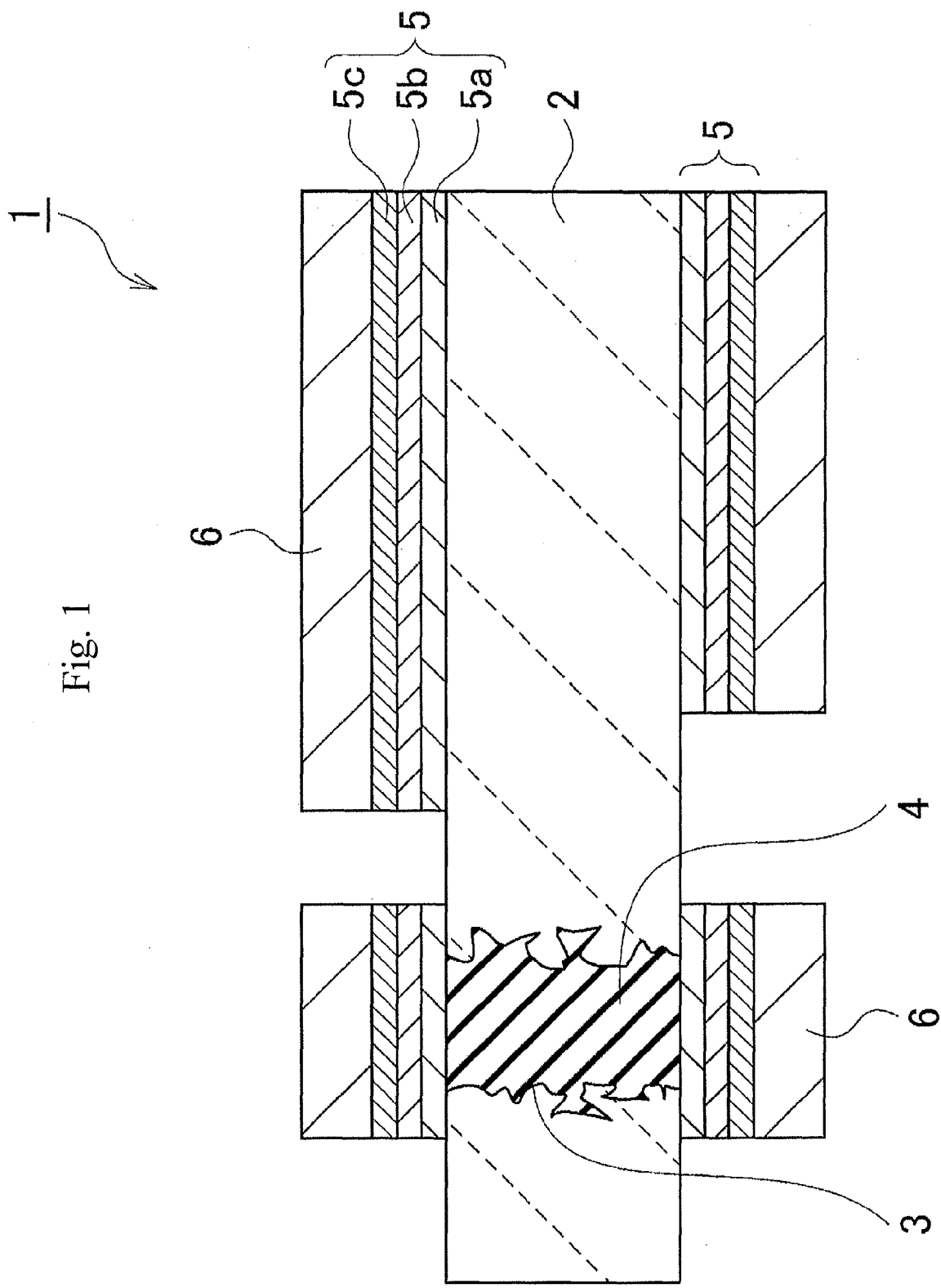
FIG. 1 is a cross sectional view showing a configuration example of a wiring substrate according to an embodiment of the present invention.

First, characteristics of an embodiment described in the specification are organized as follows:

(Characteristic 1) A crystallized glass which is a material of a glass substrate is a photosensitive glass.

(Characteristic 2) A mixed solution of acid ammonium fluoride and ammonium sulfate is used as an etching solution. A ratio of acid ammonium fluoride and ammonium sulfate is about 1:1 to 1:5, is particularly preferably 1:3.

(Characteristic 3) A target for etching is a silicon oxide, is particularly an amorphous component of the silicon oxide.

(Characteristic 4) An anchor part is formed by roughening an upper surface and/or a lower surface of the glass substrate composed of the crystallized glass. By means of an anchor effect from the anchor part, metal material, which weakly adheres to the glass substrate, can be directly stacked as a wiring pattern on the glass substrate. Thus an adhesion layer becomes unnecessary; therefore the wiring substrate is manufactured at low cost.

Hereinafter, an embodiment of the present invention will be explained in detail referring to the drawings.

The present embodiment of the present invention is explained in the following order.
1. Outline of a constitution of a wiring substrate
2. Procedure of the manufacturing method of the wiring substrate
2-1. Through-hole formation step
2-2. Glass substrate reformulation step
2-3. Etching step (sidewall surface roughening step)
2-4. Through-hole filling step
   (1) Primary plating layer formation step
   (2) Opening part sealing step
   (3) Metal filling step
   (4) Substrate surface exposure step
   (5) Substrate flattening step
2-5. Wiring pattern formation step
3. Effect of the present embodiment
4. Modification, variation and so on

1. Outline of a Constitution of a Wiring Substrate

FIG. 1 is a cross sectional view showing a configuration example of a wiring substrate according to an embodiment of the present invention. The wiring substrate 1 shown in FIG. 1 is constituted by the glass substrate 2. The glass substrate 2 is used as a core substrate of the wiring substrate 1. A plurality of through-holes (only one through-hole is shown in FIG. 1) is provided on the glass substrate 2. Metal 4 is filled in the through-hole 3. A wiring pattern 6 is formed via an adhesive layer 5 on a first surface and a second surface of the glass substrate, respectively. Therefore, the wiring substrate constitutes a double-sided wiring substrate. The first surface and the second surface of the glass substrate have a relation of a front surface and a rear surface each other. In FIG. 1, a lower surface of the glass substrate is considered as the first surface and an upper surface is considered as the second surface. The wiring pattern 6 is formed as a pattern shape depending on wiring route.

The glass substrate 2 is constituted by a photosensitive glass substrate. The photosensitive glass substrate used as the glass substrate 2 has good properties such as smoothness, hardness, insulation and workability; thus being suitable for a core substrate of the wiring substrate 1. Other than the photosensitive glass substrate, such chemical strengthened glass as soda-lime glass, alkali free glass and aluminosilicate glass and so on have these properties. These glasses may be used as the core substrate of the wiring substrate 1.

The through-hole 3 is formed as an approximately round shape in planar view. When working the present invention, placement of the through-holes 3 is not limited. Therefore, for example, the through-holes 3 may be placed at random in response to pattern shape of the desired wiring pattern 6, may be placed at a matrix with a predetermined gap, and may be placed at arrays other than matrix shape.

A surface of sidewall (hereinafter, referred to as "sidewall surface") surrounding an inside of the through-hole 3 is roughened by etching the surface in the stage before filling with metal 4. Thus an adhesion between the sidewall surface of the through-hole 3 and the metal 4 filled in the through-hole 3 is reinforced. Therefore, airtightness (such as gas barrier property) in the through-hole 3 part filled with metal is improved; thereby preventing a gas leak. A roughening treatment performing on the sidewall surface of the through-hole 3 will be explained in detail later.

Metal 4 electrically connects wiring patterns 6 formed on both surfaces (the first surface and the second surface) of the glass substrate 2 each other, as previously explained. Therefore, metal 4 is preferably metal material (conductive material) which has a low resistance. Also, in the present embodiment, electroplating is used as a means of filling the through-hole 3 with metal 4. Therefore, metal 4 is preferably a metal material suitable for electroplating. Specifically, metal 4 is composed of a metal constituted by one or an alloy constituted by two or more selected from copper, nickel, gold, silver, platinum, palladium, chromium, aluminum and rhodium. In the present embodiment, metal 4 is constituted by copper.

An adhesion layer 5 is the layer to reinforce adhesion of the wiring pattern 6 to the glass substrate 2. The adhesion layer 5 has the same pattern shape as that of the wiring pattern 6. In the present embodiment, copper constitutes the wiring pattern 6 as well as metal 4. When copper is directly stacked on the glass substrate 2, sufficient adhesion cannot be obtained. Therefore, the adhesion layer 5 intermediates between the glass substrate 2 and the wiring pattern 6. The adhesion layer 5 may have a two-layer structure including a chromium layer and a copper layer, have a three-layer structure where a chromium-copper layer intermediates between these layers, and have a multilayer structure having four layers or more. In the present embodiment, as an example, the adhesion layer 5 has the three-layer structure. Specifically, the adhesion layer 5 has the three-layer structure where the chromium layer 5a, the chromium-copper layer 5b and the copper layer 5c are stacked in sequence on the glass substrate 2.

The wiring pattern 6 is stacked on the adhesion layer 5. More specifically, the wiring pattern 6 is formed on the copper layer 5c which is outermost layer of the adhesion layer 5. A part of the wiring pattern 6 formed on the first surface of the glass substrate 2 and a part of the wiring pattern 6 formed on the second surface of the glass substrate 2 are electrically connected (conducted) via metal 4 filled in the through-hole 3.

2. Procedure of the Manufacturing Method of the Wiring Substrate

Next, the manufacturing method of the wiring substrate according to the embodiment of the present invention will be explained.

A set of manufacturing steps of the wiring substrate includes a through-hole formation step, a glass substrate reformulation step, an etching step, a through-hole filling step and a wiring pattern formation step. Of the steps, the set of the steps except for the wiring pattern formation step is included in the manufacturing method of the substrate according to the embodiment of the present invention.

(2-1. Through-Hole Formation Step)

The through-hole formation step is the process in which the through-hole 3 is formed on the glass substrate 2. The through-hole formation step corresponds to the process of preparing a glass substrate in which on the plate glass base material having the first surface and the second surface which have a relation of a front surface and a rear surface, the through-hole whose one opening part at the first surface side is determined as a first opening part and whose opening part at the second surface side is determined as a second opening part, is formed. Therefore, as for the means of obtaining the glass substrate 2 with the through-holes 3 except for performing the through-hole formation step, for example, the glass substrate 2 with through-holes 3 may be purchased from other makers. As for the method of forming the through-hole, for example, a laser machining method and a photolithography method may be used. In the present embodiment, the photolithography method is used in view of precise formation of the through-holes 3, compared to the laser machining method. The photolithography method is conducted by an exposure treatment and a development treatment. Therefore, as for the glass base material for forming the through-hole 3, a photosensitive glass in which photosensitive substances are diffused in the glass is used.

In that case, the glass substrate 2 is not particularly limited as long as it shows photosensitivity. The glass substrate 2 preferably contains as a photosensitive component at least one of gold (Au), silver (Ag), cuprous oxide ($Cu_2O$) or cerium oxide ($CeO_2$), more preferably contains two or more components. As for such glass substrate 2, for example, a glass substrate containing, in terms of mass %, 55 to 85% of $SiO_2$; 2 to 20% of aluminum oxide ($Al_2O_3$); 5 to 15% of lithium oxide ($Li_2O$), and $SiO_2+Al_2O_3+Li_2O>85\%$ as a basic component; 0.001 to 0.05% of Au, 0.001 to 0.5% of Ag, and 0.001 to 1% of $Cu_2O$ as a photosensitive metal component; and 0.001 to 0.2% of $CeO_2$ as a photosensitizer can be used.

Hereinafter, specific procedure in which the through-hole 3 is formed on the glass substrate 2 by photolithography method will be explained. First, a portion for forming the through-hole 3 on the glass substrate 2 (hereinafter referred to as "through-hole formation portion" is exposed. In this exposing treatment, photomask having a mask opening (not shown in figs.) is used. The photomask is used for, for example, forming a light blocking film (chromium film and so on) in desired pattern shape on the transparent and thin glass substrate, and blocking pass of exposing light (ultraviolet rays in the present embodiment) by this light blocking film. In the above exposing treatment, this photomask is placed closely on the first surface or the second surface of the glass substrate 2. Next, the ultraviolet ray is irradiated to the glass substrate 2 via photomask. Thus, the ultraviolet is irradiated to the glass substrate 2 through the mask openings formed on the photomask corresponding to the through-hole formation portion of the glass substrate 2.

Next, the glass substrate 2 is subjected to thermal treatment. The thermal treatment is preferably performed at a temperature between the transition point and deformation point of the photosensitive glass substrate. This is because at temperatures lower than the transition point, thermal treatment effects are not sufficiently obtained, and at temperatures exceeding the deformation point, shrinkage of the photosensitive glass substrate occurs, which may cause lowering of the exposure dimension accuracy. The thermal treatment is preferably performed for about 30 minutes to 5 hours.

Figure 2:
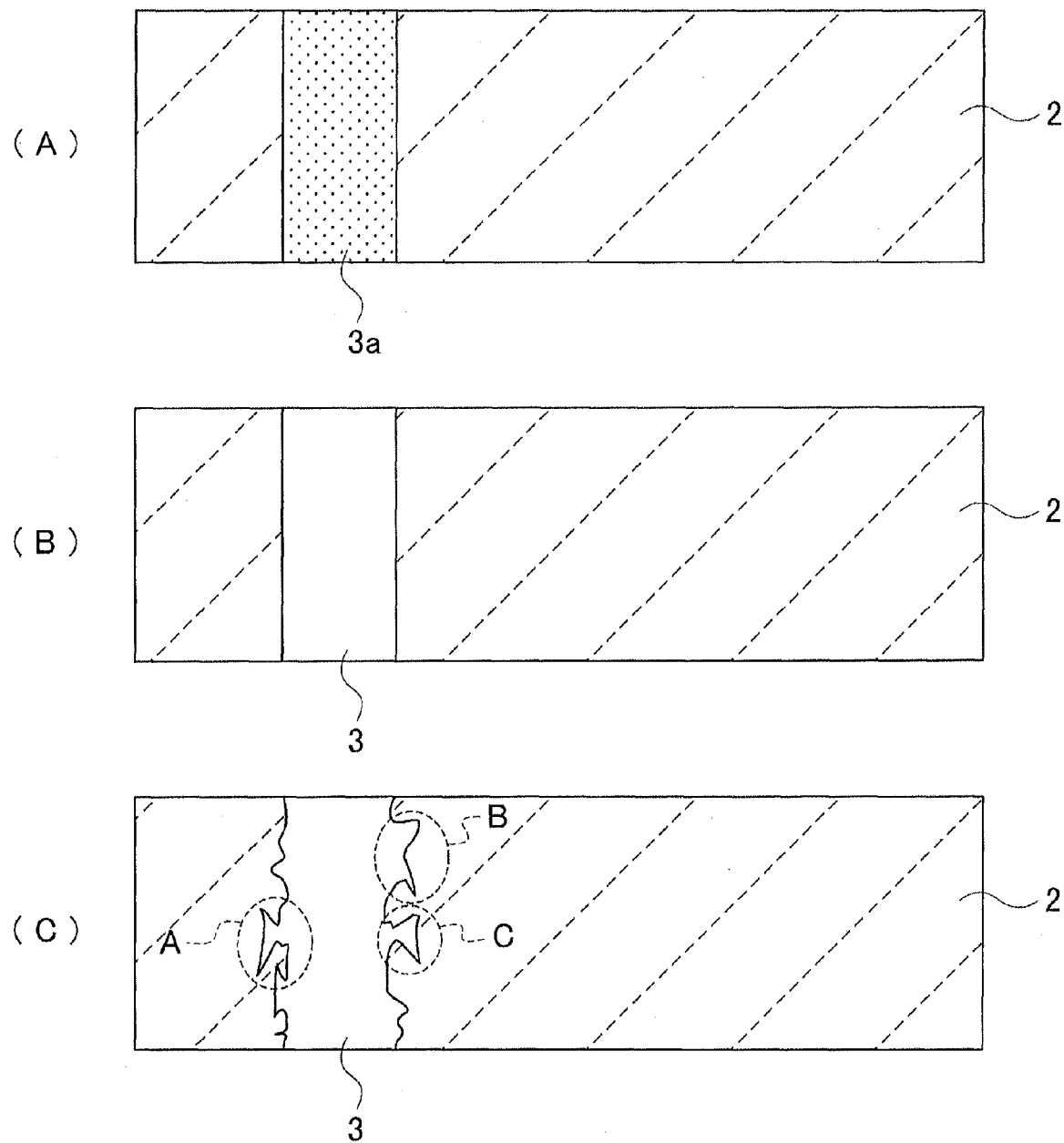
FIGS. 2A to 2C are process drawings to explain a manufacturing method of a wiring substrate according to an embodiment of the present invention (part 1).

By such ultraviolet irradiation and heat treatment, the through-hole formation portion irradiated with the ultraviolet rays is crystallized. As a result, exposure crystallization portion 3a is formed on the through-hole formation portion of the glass substrate 2, as shown in FIG. 2A.

Subsequently, the above glass substrate 2 on which the exposure crystallization portion 3a is formed is developed. In the developing treatment, as developing fluid, an etching solution such as diluted hydrofluoric acid with moderate concentration is sprayed or so to the glass substrate 2. By this developing treatment, the exposure crystallization portion 3a is selectively dissolved and removed. As a result, the through-hole 3 is formed on the glass substrate 2 as shown in FIG. 2B. This through-hole has an opening part at a lower surface (the first surface) and an opening part at an upper surface (the second surface) respectively on the glass substrate 2. Hereinafter, the opening part of the through-hole opening into the lower surface of the glass substrate 2 (the first opening part) is considered as a lower opening part, and the opening part of the through-hole opening into the upper surface of the glass substrate 2 (the second opening part) is considered as an upper opening part.

According to the above forming method of the through-hole 3 using the photolithography method, just a desired number of the through-holes 3 with an aspect ratio of about 10 can be simultaneously formed on the glass substrate 2. For example, in the case of using the glass substrate 2 having a thickness of about 0.3 to 1.5 mm, a plurality of the through-holes 3 with a diameter of about 30 to 150 μm can be formed simultaneously at desired locations. Thus, formation of fine wiring patterns and improvement of efficiency in the through-hole formation step can be attained. Further, in the case of employing a landless structure in which the land width is reduced to a very small value or zero in order to increase the density of wiring patterns, a sufficiently large space between the through-holes 3 can be secured. As a result, wirings can be formed also in the space between the through-holes 3, so that the degree of freedom in wiring pattern design can be expanded as well as the wiring density can be increased. Further, a plurality of the through-holes 3 can be formed at a narrow pitch; thereby increasing the wiring density.

(2-2. Glass Substrate Reformulation Step)

After forming the through-hole 3 on the glass substrate 2 in the through-hole formation step, the glass substrate reformulation step is performed.

The photosensitive glass substrate 2 usually contains alkali metal ions such as a lithium ion ($Li^+$) and a potassium ion ($K^+$). When these alkali metal ions leak from the substrate 2 to a wiring metal of the wiring substrate 1 and water is absorbed to the wiring metal; thus causing an ion migration that the wiring metal is ionized between circuits to which a voltage is applied and that the ionized wiring metal is reduced by receiving a charge again, which leads to allow the metal to be deposited. Due to the ion migration, in the worst case, another wiring from one circuit to another circuit is formed by the deposited metal; as a result, a short circuit may occur between circuits. Such a short circuit defect becomes remarkable when a gap between wirings is small. Therefore, in order to form fine wirings with high density, the ion migration must be inhibited.

In the glass substrate reformulation step, the whole glass substrate 2 with the through-hole 3 formed, is irradiated, for example, with ultraviolet rays in an exposure amount of about 700 $mJ/cm^2$, and then subjected to thermal treatment at a temperature of about 850° C. for about two hours; thus, the whole substrate 2 is crystallized. Due to the crystallization of the whole photosensitive glass substrate 2 in this way, alkali ions included in the glass substrate 2 are hard to move therein after the crystallization, compared to before the crystallization. Therefore, the ion migration can be inhibited.

(2-3. Etching Step (Sidewall Surface Roughening Step))

After crystallizing the glass substrate 2 in the glass substrate reformulation step, the etching step (sidewall surface roughening step) is performed.

The etching step is the process in which at least a surface (sidewall surface) of sidewall of the through-hole 3 formed on the glass substrate 2 is roughened. Surface roughening is the treatment in which the surface is turned into a roughened surface; more specifically, surface treatment is performed to cause a change of the surface roughness so that the difference of the surface roughness before and after the roughening treatment can be distinguished by SEM (Scanning Electron Microscope) observation. Note that, in the sidewall surface roughening step, at least sidewall surface of the through-hole 3 is roughened; the front and rear surfaces of the glass substrate and side edge surface of the glass substrate may be roughened, other than the sidewall surface.

The surface roughening is performed as follows: In the present embodiment, to the crystallized glass substrate 2 with the through-hole 3 formed, an etching treatment is conducted using an etching solution consisting of a mixture of acid ammonium fluoride ($NH_4F$—$HF$) and ammonium sulfate (($NH_4$)$_2SO_4$) in a predetermined ratio. By doing such etching treatment, among a variety of materials constituting the glass substrate 2, a silicon oxide which easily dissolves in the above etching solution is selectively and preferentially dissolved and removed. Specifically, a ratio of the acid ammonium fluoride and the ammonium sulfate is about 1:1 to 1:5, is particularly preferably 1:3. As a result, on the etched surface (including the sidewall surface of the through-hole 3), a lot of fine etched scratches are formed. By forming these etched scratches, the surface of glass substrate 2 is roughened.

The crystallized glass substrate 2 in the glass substrate reformulation step is composed of the silicon oxide and a lithium disilicate ($LiO$-$2SiO_2$). That is, crystallized glass substrate 2 includes a silicon oxide in the cluster state.

As for such structure of silicon oxide, an amorphous quartz glass (silica glass), crystalline quartz, tridymite and cristobalite are exemplified.

As shown in FIG. 2B, after crystallizing the glass substrate 2 with the through-hole 3 formed, by etching the sidewall surface surrounding the inside of the through-hole of the glass substrate using the above etching solution; thereby the sidewall surface is roughened and roughness are formed, as shown in FIG. 2C.

With respect to thus roughened surface, wettability of the metal materials filled in the through-hole 3 in after-mentioned metal filling step is improved, compared to the surface which is not roughened; therefore, good filling is advanced.

Also, an anchor effect is produced when the metal material penetrates into the bottom of the etched scratches formed by roughening; an adhesion strength of metal material to the roughened surface is enhanced, compared to the surface which is not roughened.

The surface roughening in this etching step does not just roughen the sidewall surface of the through-hole 3 formed on the glass substrate 2. The above etching solution can dissolve and remove the silicon oxide, particularly the amorphous component of the silicon oxide (such as quartz glass) as a target; therefore, the etching is conducted so as to form the etched scratches penetrating deeply from the surface, as shown in regions A, B and C in FIG. 2C. In such regions A, B and C, the anchor effect is significantly improved; the adhesion strength to metal material is further enhanced. As just described, in the roughened surface portion by the etching step, the anchor effect is significantly improved; thereby enhancing the adhesion strength to metal material, which weakly adheres to the surface before roughening.

Thus, as described later, airtightness (such as gas barrier property) in the portion of the through-hole 3 filled with metal is improved; thereby preventing the gas leak.

Note that, the surface where the roughness are formed by roughening in the etching step shows the anchor effect, such as the sidewall surface of the through-hole formed on the glass substrate 2 shown in FIG. 2C; therefore, the above roughened surface is hereinafter called as an anchor part.

(2-4. Through-Hole Filling Step)

After roughening at least the sidewall surface of the through-hole 3 in the sidewall surface roughening step, the through-hole filling step is performed. In the through-hole filling step, (1) primary plating layer formation step, (2) opening part sealing step, (3) metal filling step, (4) substrate surface exposure step and (5) substrate flattening step are performed in sequence.

(1) Primary Plating Layer Formation Step

Figure 3:
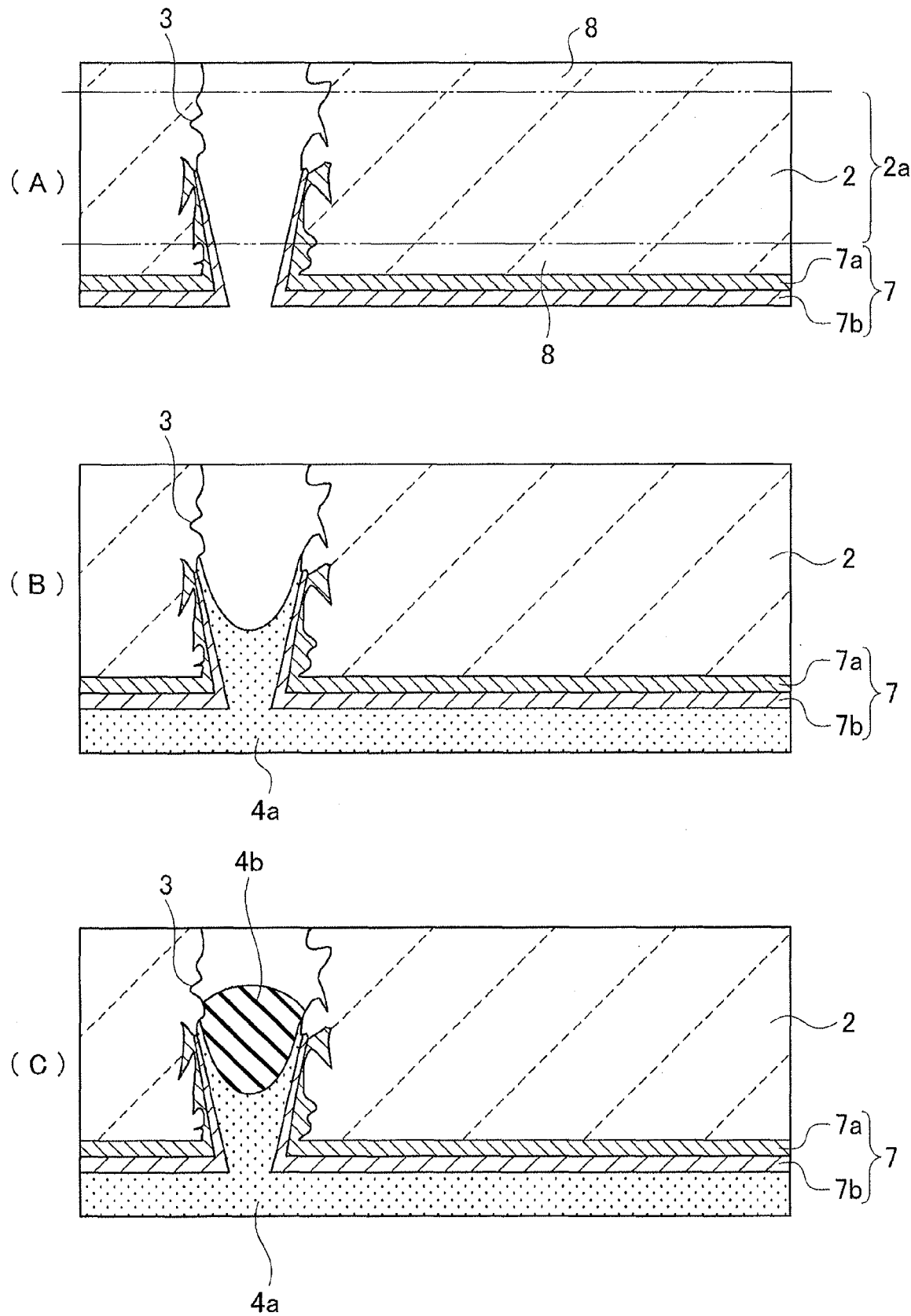
FIGS. 3A to 3C are process drawings to explain a manufacturing method of a wiring substrate according to an embodiment of the present invention (part 2).

The primary plating layer formation step is the process in which a primary plating layer 7 made of metal is formed on the lower surface side of the glass substrate 2. In the step, the primary plating layer 7 is formed on only the lower surface side of the glass substrate 2, not on the upper surface side of the glass substrate 2. Also, in the primary plating layer formation step, as shown in FIG. 3A, the primary plating layer is formed on from the edge of the lower opening part (the first opening part) of the through-hole 3 to a part of the sidewall surface of the through-hole 3 as well as the lower surface of the glass substrate 2. Due to this, while a portion of the sidewall of the through-hole 3 located at the lower surface side of the glass substrate 2 is covered with the primary plating layer 7, a portion of the sidewall of the through-hole 3 located on the upper surface side of the glass substrate 2 is exposed without covered with the primary plating layer 7. Incidentally, "a part of the sidewall surface of the through-hole" described here is considered as the sidewall portion where an area occupies a part of the through-hole 3 in depth direction and the sidewall portion where an area continues from the edge of the lower opening part of the through-hole 3 to a back side of the through-hole 3 (the upper opening part).

In the depth direction of the through-hole 3, an area for forming the primary plating layer 7 is preferable to be ensured at positions located on backward of the through-hole 3 beyond an area to be removed 8 of the glass substrate 2. The area to be removed 8 of the glass substrate 2 is the area which is supposed to be removed from the glass substrate when removing the surface part of the glass substrate 2 by machinery processing in the after-mentioned substrate planarization step. In FIG. 3A, the surface of the glass substrate 2 is supposed to be removed by machinery processing to the positions shown by two two-dot chain lines. Therefore, after finishing the machinery processing (planarizing processing) for the glass substrate 2, a substrate part 2*a* between the two two-dot chain lines remains as the glass substrate 2 finally.

The areas to be removed 8 of the glass substrate 2 are set to both sides of the glass substrate 2, respectively. Between them, with respect to the area to be removed 8 of the glass substrate 2 set to the lower surface side of the glass substrate 2, the primary plating layer 7 is formed thereon so that the lower opening part of the through-hole 3 remains sealed by the primary plating layer 7 and a first plating layer 4*a* (described below) even after removing the surface of the glass substrate 2 by machinery processing. Specifically, the primary plating layer 7 is formed at the backward of the through-hole 3 beyond the boundary position (the position shown by the two-dot chain line) of the area to be removed 8.

The primary plating layer 7 is preferably formed by sputtering which causes good adhesion with the glass substrate 2. Specifically, on the lower surface side of the glass substrate 2, for example, the primary plating layer 7 which has two-layer structure is formed by stacking chromium layer 7*a* whose thickness is about 0.05 μm and copper layer 7*b* whose thickness is about 1.5 μm in sequence using the sputtering. In doing so, a part of scattered metal atoms from a target (hereinafter referred to as "sputtering atoms") goes into the through-hole 3 from the lower opening part of the through-hole 3 and adheres to the sidewall of the through-hole 3. For this reason, in order to make the sputtering atoms effectively adhere to the sidewall of the through-hole 3, in the above through-hole formation step, it is preferable to form the through-hole 3 on the glass substrate 2 so that a cross sectional shape of the through-hole 3 at the lower opening part side becomes a spread shape (flared shape).

Figure 4:
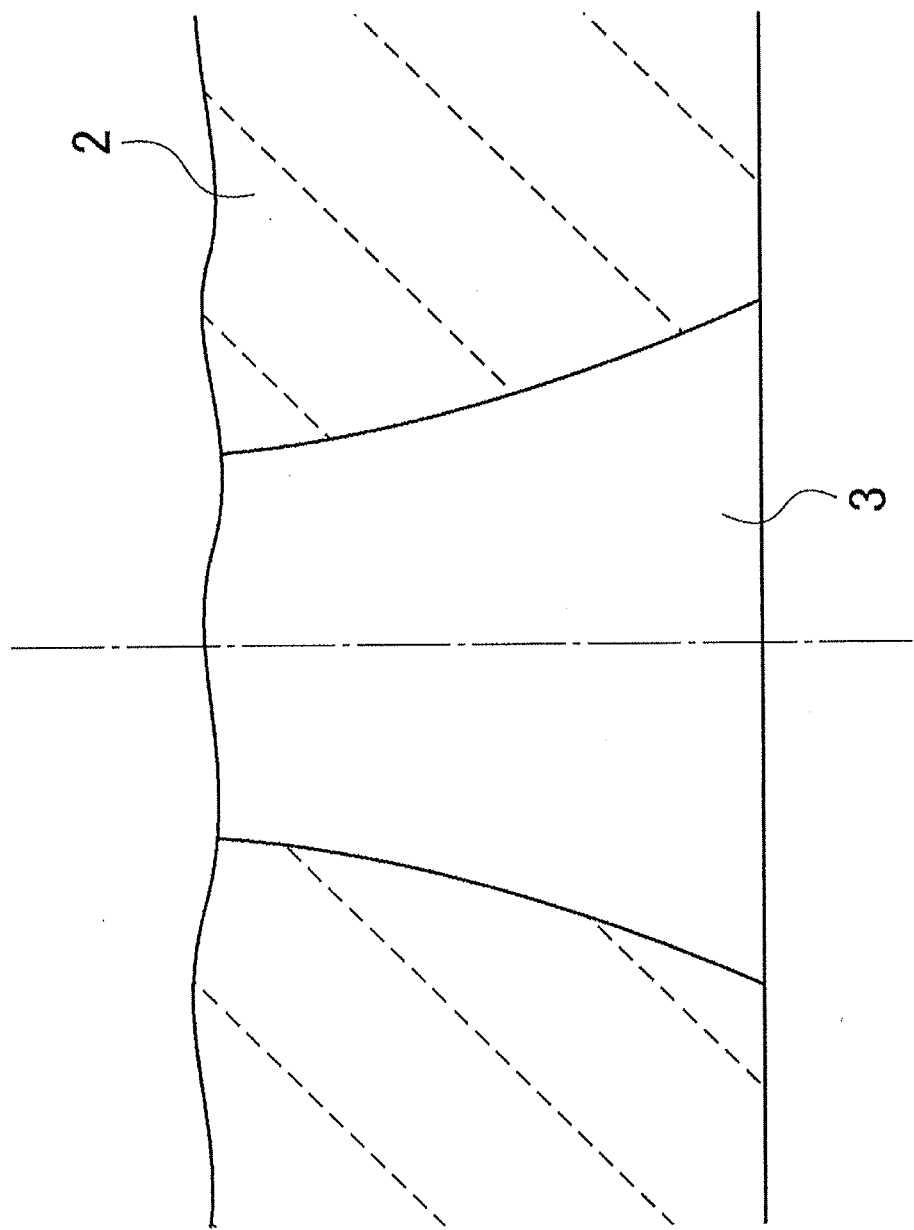
FIG. 4 is an enlarged view showing a cross sectional shape of a through-hole according to an embodiment of the present invention.

Specifically, in the above through-hole formation step, when dissolving the exposure crystallization portion 3*a* by the etching solution, it is controlled that a portion near the edge of the lower opening part of the glass substrate 2 is made to be more soluble by adjusting concentration of the etching solution accordingly in the depth direction of the through-hole 3, compared with a portion far the edge of the lower opening part. Due to this, the through-hole 3 is formed so that a diameter of the through-hole 3 becomes larger gradually from the center toward the upper and the lower opening parts in the depth direction. By forming the through-hole 3 in this way, when sputtering the above chromium layer 7*a* and copper layer 7*b*, the sidewall of the through-hole 3 at the lower opening part side is on a tilt and disposed in a flared shape to the central axis of the through-hole 3 (shown by chain line) as shown in FIG. 4. Therefore, the sputtering atoms which go into the through-hole 3 from the lower opening part of the through-hole 3 by the sputtering become easier to adhere to the sidewall surface of the through-hole 3. Formation range of the primary plating layer 7 in the depth direction of the through-hole 3 is, for example, preferably at least a one-twentieth or more, more preferably a one-tenth or more, further preferably about a one-fifth to a half of the depth of the through-hole 3 (thickness of the glass substrate 2); the sidewall surface of the through-hole 3 may be coated with the primary plating layer 7 in the above range.

Note that, in FIG. 4, in order to avoid making the drawing cumbersome and complicated, the state of the roughened sidewall surface surrounding the inside of the through-hole 3 is omitted; however, in fact, the sidewall surface is roughened and the anchor part is formed, as shown in FIG. 2C.

(2) Opening Part Sealing Step

The opening part sealing step is the step in which the lower opening part is sealed with the first plating layer 4*a* by forming the first plating layer 4*a* which is the metal layer using electroplating on the lower side of the glass substrate 2. In this step, as shown in FIG. 3B, the lower opening part of the through-hole 3 is sealed with the first plating layer 4*a* by making the first layer 4*a* grow from the surface of the primary plating layer 7 not only on the lower surface of the glass substrate 2 but also the inside of the through-hole 3. In the present embodiment, the first plating layer 4*a* is formed by the electrolytic copper plating.

In the electroplating of the opening part sealing step, for example, in a plating bath containing a copper sulfate aqueous solution as a plating solution, a copper plate as an anode and the primary plating layer 7 of the glass substrate 2 as a cathode are arrayed respectively. In so doing, the lower surface side of the glass substrate 2 is faced toward the anode (copper plate) in order to conduct the electroplating from the lower surface side (the first surface side) of the glass substrate 2 on which the primary plating layer 7 is formed. Then, the anode and cathode are connected with the DC power supply and applied with a predetermined voltage; thereby making copper deposited on the surface of the primary plating layer 7. Depending on a diameter of the through-hole 3, the formation of the first plating layer 4*a* is performed under the conditions that current density is relatively higher than usual (for example, about 1 $A/dm^2$ to 5 $A/dm^2$). Further, this current density also depends on a pH of the plating bath or ion concentration of copper; therefore, a value of the current density is set to an appropriate value. Generally, in the case where the concentration of plating solution is high, the current density can be set higher value, compared to a case where the concentration of plating solution is low. By performing the electroplating under these current density conditions, the lower opening part of the through-hole 3 can be sealed with the first plating layer 4*a*. In this case, a part of the first plating layer 4*a* stacked on the primary plating layer 7 by the electroplating grows toward the backward of the through-hole 3 beyond the primary plating layer 7 as if crawling up the sidewall surface of the through-hole 3. Also, a surface of the first plating layer 4*a* inside the through-hole 3 becomes hollow with nearly a U-shaped cross sectional shape in the center of the through-hole 3.

(3) Metal Filling Step

The metal filling step is the step in which the through-hole 3 is filled with metal by depositing the second plating layer 4*b* which is the metal layer inside the through-hole 3 using the electroplating from the upper surface side of the glass substrate 2. "The electroplating from the upper surface side of the glass substrate 2" described here shows the electroplating which is conducted by placing the anode so as to face the upper surface side of the glass substrate 2 among the upper surface and the lower surface of the glass substrate 2. Also, "The through-hole 3 is filled with metal" shows the filling of a portion which is not embedded with the first plating layer 4*a* inside the through-hole 3 (non-filling portion) with metal, when the lower opening part of the through-hole 3 is sealed with the first plating layer 4a in the aforementioned opening part sealing step.

In the metal filling step, as shown in FIG. 3C, the through-hole 3 is filled with metal by ccc growing the second plating layer 4b from the surface of the first plating layer 4a toward the upper opening part of the through-hole 3 inside the through-hole 3. In the present embodiment, the second plating layer 4b is formed in the through-hole 3 by copper electroplating as well as the aforementioned first plating layer 4a. In this case, inside the through-hole 3, the chromium and the copper which constitute primary plating layer (chromium layer 7a and copper layer 7b) exists as well as the copper constitutes the first plating layer 4a and the second plating layer 4b; thereby the through-hole 3 becomes filled with these metals.

When performing the electroplating in the metal filling step, for example, a copper plate as the anode and the first plating layer 4a of the glass substrate 2 as the cathode are arrayed respectively in the plating bath containing the copper sulfate aqueous solution as the plating solution. In so doing, the upper surface side of the glass substrate 2 is faced to the anode (copper plate) in order to perform the electroplating from the upper surface side (the second surface side) of the glass substrate 2 on which the first plating layer 4a is not formed. Then, the anode and the cathode are connected with the DC power supply and applied with a voltage within the predetermined range; copper is deposited over the surface of the first plating layer 4a. Due to this, the through-hole 3 is filled with both the primary plating layer 7 and the first plating layer 4a which are already formed before in the through-hole 3 and the second plating layer 4b stacked on the first plating layer 4a. This electroplating is performed under the relatively low current density conditions (for example, about 0.2 A/dm$^2$ to 0.8 A/dm$^2$). In the step, the electroplating is performed under the relatively low current density conditions (for example, 0.5 A/dm$^2$), compared to the current density employed in the electroplating of the above opening part sealing step. Also, a pulse plating method, as it is called, may be employed as this electroplating. The pulse plating method is effective in suppressing variations in the deposition rate of the plating metal in the through-hole 3. Also, it is important that an applied voltage is set to a hydrogen overvoltage or less. The reason is that it is very difficult to remove hydrogen gas foam generated when the shape of the through-hole 3 has a high aspect ratio.

Figure 5:
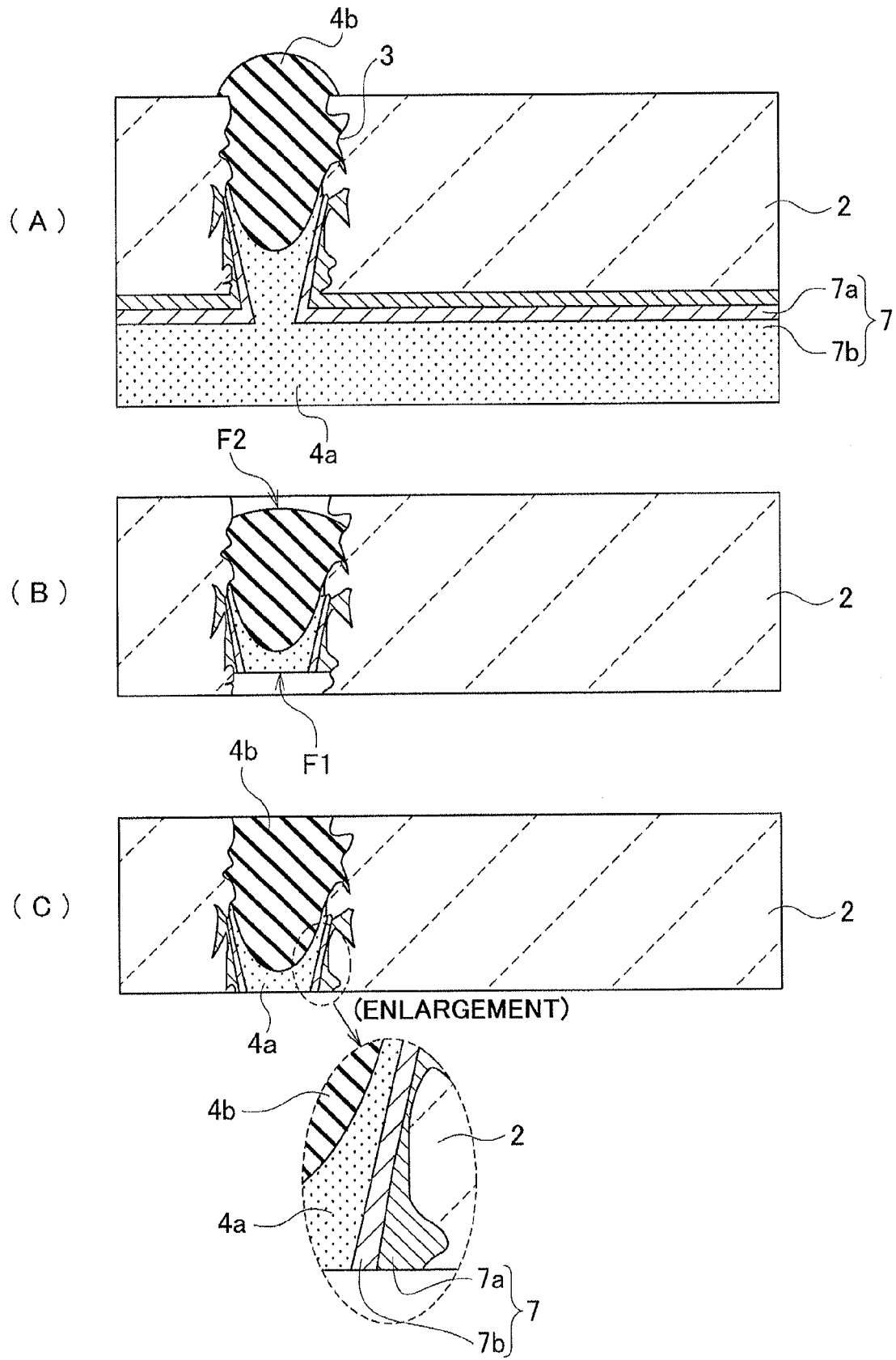
FIGS. 5A to 5C are process drawings to explain a manufacturing method of a wiring substrate according to an embodiment of the present invention (part 3).

By performing the electroplating under such conditions, copper ions in the plating bath move from the upper opening part of the through-hole 3 into the inside of the through-hole 3 and are deposited over the surface of the first plating layer 4a. As a result, inside the through-hole 3, the through-hole 3 is gradually filled with the second plating layer 4b by making the second plating layer 4b grow from the surface of the first plating layer 4a which is already formed before toward the upper opening part. Then, when the surface of the second plating layer 4b reaches the upper opening part of the through-hole 3, the through-hole 3 becomes completely filled with the second plating layer 4b. Herein, in order to ensure the filling of the through-hole 3 by the growth of the second plating layer 4b, as shown in FIG. 5A, the electroplating continues until the surface of the second plating layer 4b is projected from the upper surface side of the glass substrate 2.

(4) Substrate Surface Exposure Step

The substrate surface exposure step is the step in which a lower surface of the glass substrate 2 is exposed by removing the first plating layer 4a and the primary plating layer 7 from the lower surface of the glass substrate 2. In this step, as shown by comparing FIG. 5A with FIG. 5B, not only the first plating layer 4a and the primary plating layer 7 which cover the lower surface of the glass substrate 2 are removed but also the second plating layer 4b which is projected toward the upper surface side of the glass substrate 2 is dented.

In the substrate surface exposure step, an etching treatment is performed using a chemical solution suitable for constituent material of the film targeted for removal. In the present embodiment, an etching treatment is performed in twice with changing the chemical solution. First, in the first etching treatment, for example the copper constituting the first plating layer 4a and the copper constituting the copper layer 7b of the primary plating layer 7 are removed (dissolve) by the etching using, for example, the chemical solution whose main component is ferric chloride. Also, in the first etching treatment, the copper constituting the second plating layer 4b is removed by the etching. Next, in the second etching treatment, the chromium constituting the chromium layer 7a of the primary plating layer 7 is removed by the etching using, for example, the chemical solution whose main component is potassium ferricyanide.

Incidentally, in the first etching treatment, the copper is removed by the etching until the chromium layer 7b is exposed at the lower surface side of the glass substrate 2. However, inside the through-hole 3, an etching time and so on is adjusted so that a backdown surface F1 of the first plating layer 4a by the etching remains within the area 8 to be removed of the glass substrate 2 (referring to FIG. 3A). Also, at the upper surface side of the glass substrate 2, the surface of the second plating layer 4b is brought to be back in the through-hole 3 by the first etching treatment so that the surface of the second plating layer 4b is not projected from the upper surface of the glass substrate 2. Also in this case, the etching time and so on is adjusted so that a backdown surface F2 of the second plating layer 4b by the etching remains within the area 8 to be removed of the glass substrate 2 (referring to FIG. 3A).

(Substrate Planarization Step)

The substrate planarization step is the step in which at least the lower surface among the upper surface and the lower surface of the glass substrate is planarized by machinery processing. In the surface and the lower surface) of the glass substrate 2 are planarized by machinery processing. Specifically, the upper surface and the lower surface of the glass substrate 2 are planarized by both sides lapping, after that, the both sides of the glass substrate 2 are polished for finish if needed. By such machinery processing, each surface part at the upper surface side and the lower surface side of the glass substrate 2 is removed respectively in alignment with the boundary positions of the area to be removed 8 (the positions shown by the two-dot chain lines in FIG. 3A). As a result, as shown in FIG. 5C, both end surfaces of the metal filling the through-hole 3 are polished for finish so that the both end surfaces are flush with the upper surface and the lower surface of the glass substrate 2 respectively, as well as the both surfaces of the glass substrate 2 are planarized. Also, the lower opening part of the through-hole 3 of the glass substrate 2 is sealed by the primary plating layer 7 and the first plating layer 4a. In this case, inside the through-hole 3, the copper and the chromium constituting the primary plating layer 7 and the copper constituting the plating layers 4a and 4b remain. Then, the through-hole 3 is filled with these metals. In this way, the glass substrate 2 with the through-hole 3 filled with metal 4 is obtained as shown in the above FIG. 1.

Note that, prior to the substrate planarization step, by the above substrate surface exposure step, the first plating layer 4a and the primary plating layer 7 are removed from the lower surface of the glass substrate 2; the lower surface of the glass substrate 2 is exposed; thereby both the upper surface and the lower surface of the glass substrate 2 become exposed surfaces composed of the same (common) material "glass". Because of this, in the substrate planarization step, both sides lapping can be performed as a planarization processing of the glass substrate 2 by machinery processing. Thereby it becomes possible to planarize both sides of the glass substrate at the same time. Therefore, cost of manufacturing the substrate can be reduced, compared with the case where the planarization processing is performed to the surfaces of the glass substrate 2 one by one. Incidentally, when the upper surface and the lower surface of the glass substrate 2 are exposed surfaces composed of different materials each other, it becomes difficult to apply the both sides lapping; thus it is necessary to planarize the surface of the glass substrate one by one.

As just described, in the through-hole filling step, metal material is filled in the anchor part at the beginning. Then, the filling of metal material proceeds further so as to continue into the metal material filled in the anchor part. Thus, the airtightness (such as a gas barrier property) in the through-hole 3 part is improved since adhesion strength of the metal material filled in the through-hole 3 is improved by forming the anchor part on the sidewall surface of the through-hole 3; thereby preventing the gas leak.

Also, in the primary plating layer formation step, the primary plating layer 7 is formed at the position of the backward of the through-hole 3 beyond the area to be removed 8 of the glass substrate 2. For this reason, in the above substrate planarization step, the lower opening part of the through-hole 3 remains sealed with the primary plating layer 7 and the first plating layer 4a even after removing the surface part of the lower surface of the glass substrate 2 by machinery processing. Under this situation, the first plating layer 4a stays strongly adhered to the sidewall surface of the through-hole 3 via the primary plating layer 7 by an effect of reinforcing adhesion brought by the primary plating layer 7. For this reason, the adhesion between the through-hole 3 and metal 4 becomes stronger compared with the case where manufacturing condition in which posterior to the substrate planarization step the primary plating layer 7 fails to remain in the through-hole 3 after the substrate planarization step is adopted. Therefore, airtightness (such as gas barrier property) in the through-hole 3 filled with metal 4 can be further improved.

(2-5 Wiring Pattern Formation Step)

The wiring pattern formation step is the step in which the wiring pattern 6 is formed on at least one of the upper surface and the lower surface of the glass substrate 2. The wiring pattern formation step includes an adhesion layer formation step, a wiring layer formation step and a patterning step. Hereinafter, each step will be explained.

(Adhesion Layer Formation Step)

Figure 6:
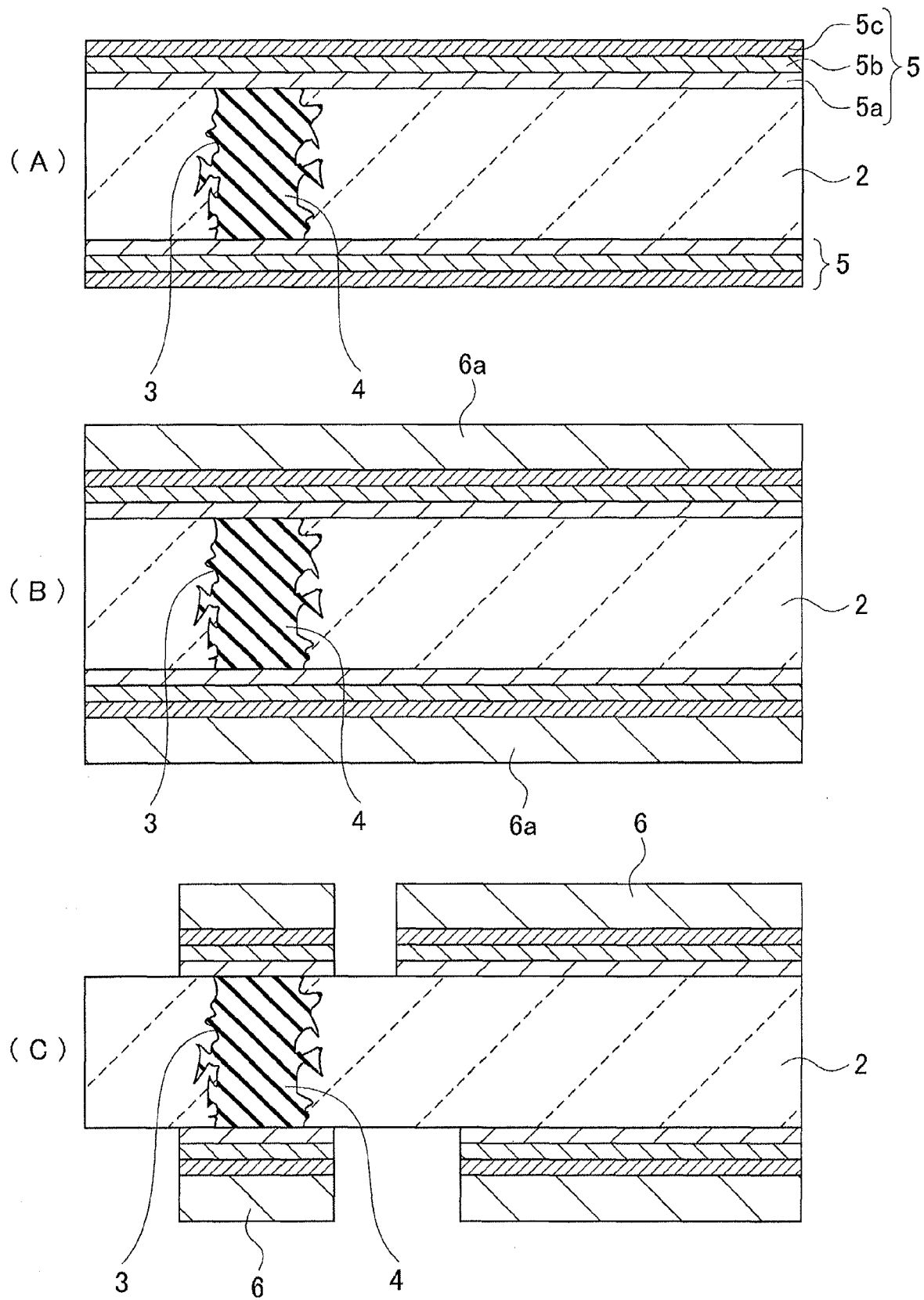
FIGS. 6A to 6C are process drawings to explain a manufacturing method of a wiring substrate according to an embodiment of the present invention (part 4).

In the adhesion layer formation step, as shown in FIG. 6A, the adhesion layer 5 is formed on each surface of the glass substrate 2 by the sputtering method. In the present embodiment, the adhesion layer 5 is formed as the three-layer structure where the chromium layer 5a, the chromium-copper layer 5b and the copper layer 5c are stacked in sequence. It is preferable that each of the metal layers constituting the adhesion layer 5 is formed to be as thin as possible in view of an amount of side etching in the wiring pattern 6 formation using an etching described later. However, if a thickness of each of the metal layers in the adhesion layer 5 is too thin, the adhesion layer 5 is likely to be removed by a treatment for patterning of the wiring layer. Therefore, for example, when the adhesion layer 5 is formed as the three-layer structure as previously described, it is preferable that the thickness of the chromium layer 5a is about 0.04 µm to 0.1 µm, the thickness of the chromium-copper layer 5b is about 0.04 µm to 0.1 µm and the thickness of the copper layer 5c is about 0.5 µm to 1.5 µm; thereby a total thickness of the adhesion layer 5 can be reduced to 2 µm or less.

(Wiring Layer Formation Step)

In the wiring layer formation step, as cccc shown in FIG. 6B, on each surface of the glass substrate 2, a wiring layer 6a is formed over the adhesion layer 5 formed before. The wiring layer 6a is formed by the electroplating. It is preferable that, in a similar way of the formation of the adhesion layer 5, this wiring layer 6a is formed to be as thin as possible in view of the amount of the side etching. However, in the case where the wiring layer 6a is too thin, when temperature changes of the glass substrate 2 are repeated due to the usage environment, metal fatigue may occur in the wiring pattern due to the deference in coefficient of thermal expansion between the wiring pattern 6a and the glass substrate 2. For this reason, in order to ensure connection reliability of the wiring pattern against the metal fatigue, the wiring layer 6a needs to have an adequate thickness. Specifically, the thickness of the wiring layer 6a is preferably about 1 µm to 20 µm, more preferably about 4 µm to 7 µm. When the thickness of the wiring layer 6a is less than 1 µm, it is highly possible that a break of the wiring may occur due to the above metal fatigue. Further, when the thickness of the wiring layer 6a is more than 20 µm, it becomes difficult to meet the demands for making the wiring pattern finer.

(Patterning Step)

In the patterning step, as shown in FIG. 6C, on each surface of the glass substrate 2, the wiring pattern 6 is formed by patterning the adhesion layer 5 and the wiring layer 6a using the photolithography method and the etching. Specifically, after covering the wiring layer 6a of the glass substrate 2 with a resist layer which is not shown in figure, a resist pattern is formed by exposing and developing this resist layer; as a result, a part of the wiring layer 6a of the glass substrate 2 (a part to be remained as the wiring pattern) becomes covered with the resist pattern. Next, an exposed portion of the wiring layer 6a and the adhesion layer 5 is removed by the etching using the resist pattern as a mask. As a result, the wiring pattern 6 having the same pattern as the resist pattern is obtained. The resist used herein may be a liquid resist, a dry film resist or an electrodeposited resist. Also, the resist type may be either positive or negative. Generally, the positive resist has a higher resolution compared with the negative resist; therefore, the positive resist is suitable for forming a fine wiring pattern compared with the negative resist.

3. Effect of the Present Embodiment

According to the manufacturing method of the substrate, the manufacturing method of the wiring substrate, the glass substrate and the wiring substrate, the following effects are obtained.

(First Effect)

According to the present embodiment, the anchor part is formed by selectively etching the silicon oxide located near the sidewall surrounding the inside of the through-hole 3 formed on the crystallized glass substrate 2. Then, after forming the anchor part, the metal material is filled inside the through-hole 3. Therefore, the glass substrate 2 with high the airtightness between the sidewall surrounding the inside of the through-hole 3 and the metal material filled in the through-hole 3 can be manufactured; thereby preventing the gas leak.

(Second Effect)

According to the present embodiment, the etching treatment is performed using the etching solution consisting of a mixture of acid ammonium fluoride ($NH_4F \cdot HF$) and ammonium sulfate (($NH_4)_2SO_4$) in a predetermined ratio; the etching solution roughen the sidewall surface with targeting the silicon oxide of the glass substrate 2, particularly the quartz glass. Thereby, unlike the roughening treatment which just roughen the sidewall surface of the through-hole 3 formed on the glass substrate 2, the anchor part which has remarkably high adhesion strength can be formed since the etched scratches which is deep from the surface and complicated is formed. In particular, the above effect is further enhanced by selecting the ammonium sulfate as the strong acid ammonium salt.

(Third Effect)

According to the present embodiment, the manufacturing method of the wiring substrate is configured by utilizing the manufacturing method of the substrate including a series of the above steps. Therefore, in the wiring substrate 1 obtained by the manufacturing method, due to the high airtightness between the sidewall surrounding the inside of the through-hole 3 and the metal material filled in the through-hole 3, the gas leak is prevented; thereby realizing a good stacking, for example, in the case of stacking the metal layer on the front and rear surfaces of the glass substrate 2.

(Fourth Effect)

According to the present embodiment, the anchor part is formed in the crystallized glass substrate 2 by partially removing the silicon oxide located on near the sidewall surrounding the inside of the through-hole 3 formed. Further, metal material is filled inside the through-hole 3 with the anchor part formed. Therefore, the glass substrate 2 having high airtightness between the sidewall surrounding the inside of the through-hole 3 and the metal material filled in the through-hole 3 can prevent the gas leak. Note that, the anchor part is preferably formed by selectively etching the silicon oxide.

(Fifth Effect)

According to the present embodiment, the airtightness between the sidewall surrounding the inside of the through-hole 3 and the metal material filled in the through-hole 3 formed on the glass substrate 2 constituting the wiring substrate 1 is high; thereby the gas leak is prevented in the wiring substrate 1. Therefore, for example, the wiring substrate 1 where metal layers are favorably stacked on the front and rear surfaces of the glass substrate can be obtained.

4. Variation, Modification and so on

Note that, the technical scope of the present invention is not limited to the above embodiments, and includes embodiments with various modifications and improvements as far as specific effects obtained by constituent features of the invention and combination thereof are derived.

For example, in the above-mentioned embodiment, the manufacturing method of the wiring substrate are explained, however, the present invention is not limited to the embodiments and can be realized by a manufacturing method of substrate utilized as an application except for the wiring substrate. Further, the present embodiment includes a glass substrate and a wiring substrate.

Also, in the above-mentioned embodiment, the glass substrate having photosensitive property is used as the glass substrate 2; however, other glass substrate having no photosensitive property may be used. In this case, in the through-hole formation step, the through-hole 3 can be formed on the glass substrate 2 by the method except for the photolithography method, for example, laser machining method.

Figure 7:
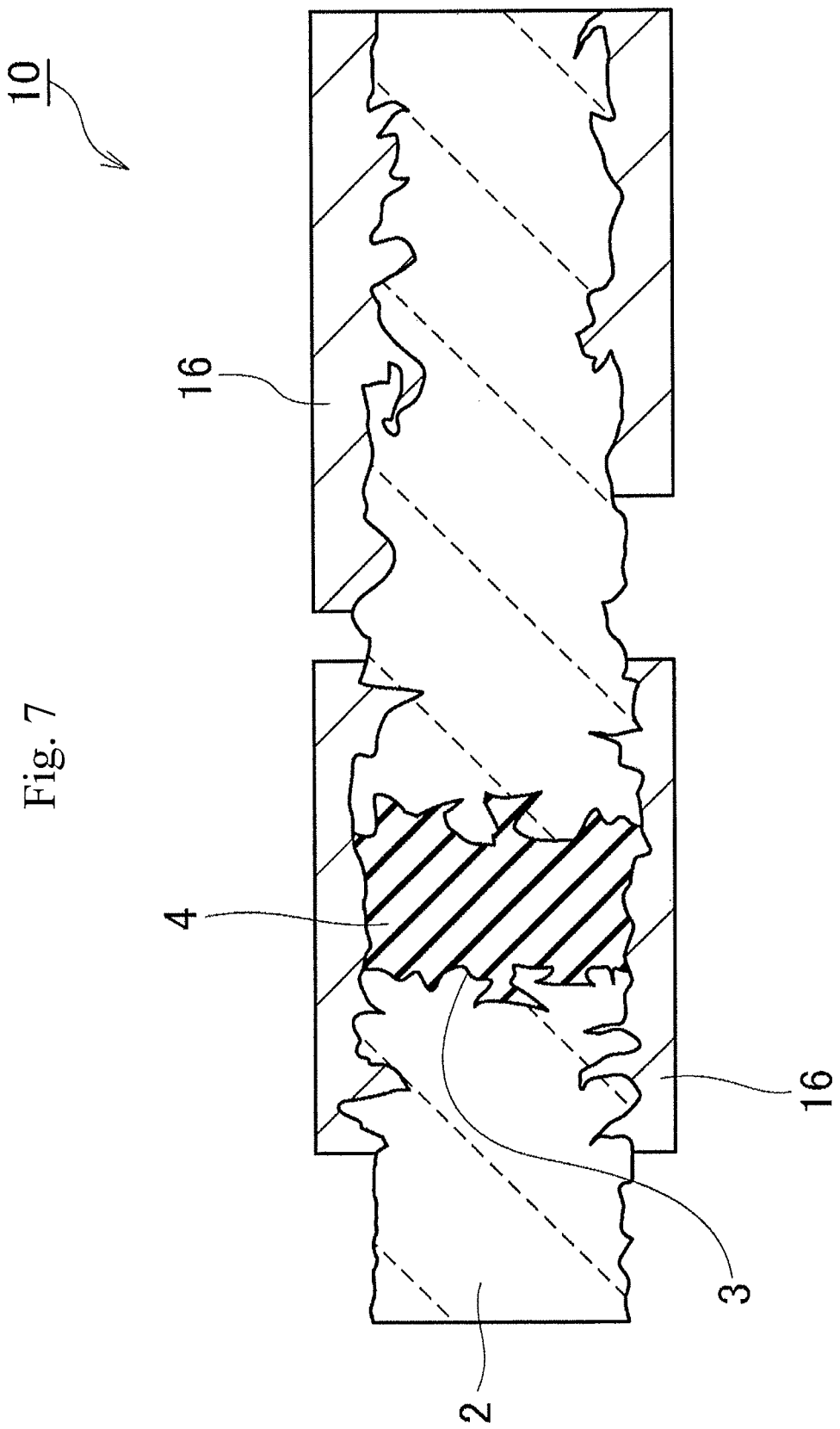
FIG. 7 is a cross sectional view showing a configuration example of a wiring substrate as a modification of the present invention.

FIG. 7 is a cross sectional view showing a configuration of a wiring substrate 10 as a modification of the present invention.

As shown in FIG. 7, the anchor part formed on the sidewall surface inside the through-hole 3 may be also formed on the upper and lower surfaces of the crystallized glass substrate 2. Thus the anchor effect is produced on the upper and lower surfaces of the crystallized glass substrate 2 as well; thereby metal material composed of, for example, copper, which weakly adheres to the glass substrate 2, can be directly stacked on the glass substrate 2 as a wiring pattern 16.

The wiring pattern 16 is directly formed on the first surface and the second surface of the glass substrate 2. The first surface and the second surface of the glass substrate 2 are roughened by the etching in the stage before stacking the wiring pattern 16 on the surfaces. Therefore, the adhesion strength between the first surface or the second surface of the glass substrate 2 and the wiring pattern 16 becomes enhanced. For this reason, the wiring pattern 16 can be directly formed on the first surface and the second surface of the glass substrate 2, which weakly adheres to the wiring pattern. The surface roughening treatment to the first surface of the glass substrate 2 is the same as the above etching step (sidewall surface roughening step).

Thereby, in FIGS. 1 and 6C, there is no need for forming the adhesion layer 5, which has need to be formed in order to form the wiring pattern 6; thus, the wiring substrate 10 can be manufactured at extremely low cost.

The invention claimed is:

1. A glass substrate composed of a glass including a silicon oxide, wherein:
    the glass substrate has no wiring pattern on a front surface and a rear surface thereof;
    a through-hole communicating with a front surface and a rear surface of the glass substrate is filled with a metal material; and
    an anchor part, made of fine roughness that is defined by minute recessions and protrusions, is formed on a sidewall surrounding an inside of said through-hole and said filled metal penetrates into at least part of roughness of the anchor part.

2. The glass substrate as set forth in claim 1, wherein said glass is a crystallized glass.

3. A wiring substrate, wherein
    a wiring pattern is formed on at least one of one surface side and the other surface side of the glass substrate as set forth in claim 2.

4. The glass substrate as set forth in claim 2, wherein said crystallized glass includes the silicon oxide and a lithium disilicate.

5. A wiring substrate, wherein
    a wiring pattern is formed on at least one of one surface side and the other surface side of the glass substrate as set forth in claim 1.

6. A manufacturing method of a substrate comprising a glass substrate composed of a glass including a silicon oxide, wherein a through-hole communicating with a front surface and a rear surface of the glass substrate is filled with metal material;
    the method comprising the steps of:
    an etching step of forming an anchor part, made of fine roughness that is defined by minute recessions and protrusions caused by roughing a sidewall surface of the through-hole, by selectively etching a silicon oxide located on near a sidewall surrounding an inside of said through-hole before filling with a metal material and before forming a wiring pattern on the front surface and the rear surface of the glass substrate; and a filling step of filling the inside of said through-hole with the metal material after said etching step.

7. The manufacturing method of the substrate as set forth in claim 6, wherein said glass is a crystallized glass.

8. The manufacturing method of the substrate as set forth in claim 7, wherein in said etching step, a mixture solution of acid ammonium fluoride and strong acid ammonium salt is used as the etching solution.

9. A manufacturing method of a wiring substrate, wherein after manufacturing a substrate in which an inside of a through-hole of a glass substrate is filled with a metal material by the method as set forth in claim 8, a wiring pattern is formed on at least one of one surface side and the other surface side of said glass substrate.

10. A manufacturing method of a wiring substrate, wherein after manufacturing a substrate in which an inside of a through-hole of a glass substrate is filled with a metal material by the method as set forth in claim 7, a wiring pattern is formed on at least one of one surface side and the other surface side of said glass substrate.

11. The manufacturing method of the substrate as set forth in claim 7, wherein said crystallized glass includes the silicon oxide and a lithium disilicate.

12. The manufacturing method of the substrate as set forth in claim 6, wherein in said etching step, a mixture solution of acid ammonium fluoride and strong acid ammonium salt is used as the etching solution.

13. A manufacturing method of a wiring substrate, wherein after manufacturing a substrate in which an inside of a through-hole of a glass substrate is filled with a metal material by the method as set forth in claim 12, a wiring pattern is formed on at least one of one surface side and the other surface side of said glass substrate.

14. The manufacturing method of the substrate as set forth in claim 12, wherein a ratio of the acid ammonium fluoride and the ammonium sulfate in the mixture solution is 1:1 to 1:5.

15. A manufacturing method of a wiring substrate, wherein after manufacturing a substrate in which an inside of a through-hole of a glass substrate is filled with a metal material by the method as set forth in claim 6, a wiring pattern is formed on at least one of one surface side and the other surface side of said glass substrate.

16. The manufacturing method of the substrate as set forth in claim 6, wherein said etching step includes surface treatment performed to cause a change of the surface roughness so that the difference of the surface roughness before and after the roughening treatment can be distinguished by SEM (Scanning Electron Microscope) observation.

\* \* \* \* \*